United States Patent
Jawarani

(10) Patent No.: US 7,105,429 B2
(45) Date of Patent: Sep. 12, 2006

(54) METHOD OF INHIBITING METAL SILICIDE ENCROACHMENT IN A TRANSISTOR

(75) Inventor: Dharmesh Jawarani, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 358 days.

(21) Appl. No.: 10/797,222

(22) Filed: Mar. 10, 2004

(65) Prior Publication Data

US 2005/0202664 A1 Sep. 15, 2005

(51) Int. Cl.
*H01L 21/3205* (2006.01)

(52) U.S. Cl. ............. 438/592; 438/682; 438/527; 438/530; 438/597; 438/301; 257/E21.199; 257/E21.296; 257/E21.636

(58) Field of Classification Search ........... 438/592, 438/682, 527, 530, 597, 301
See application file for complete search history.

(56) References Cited

U.S. PATENT DOCUMENTS

| | | | | |
|---|---|---|---|---|
| 4,788,160 | A * | 11/1988 | Havemann et al. | 438/305 |
| 5,084,417 | A * | 1/1992 | Joshi et al. | 438/653 |
| 6,096,647 | A * | 8/2000 | Yang et al. | 438/682 |
| 6,218,249 | B1 * | 4/2001 | Maa et al. | 438/300 |
| 6,297,114 | B1 * | 10/2001 | Iwata et al. | 438/305 |
| 6,319,785 | B1 * | 11/2001 | Ha et al. | 438/305 |

FOREIGN PATENT DOCUMENTS

WO  WO 00/36634  6/2000

OTHER PUBLICATIONS

Wielunski, L. et al.; "Alteration of NI silicide formation by N implantation"; Applied Physics Letters; USA; Jan. 15, 1981; pp. 106-108; vol. 38, No. 2; American Institute of Physics; USA.

D'Heurle, F. et al. ; "Diffusion in intermetallic compounds with the $CaF_2$ structure: A marker study of the formation of $NiSi_2$ thin films"; Journal of Applied Physics; Aug. 1982; pp. 5678-5681; vol. 53, No. 8; American Institute of Physics; USA.

Cheng, L.W. et al.; "Effects of nitrogen ion implantation on the formation of nickel silicide contacts on shallow junctions"; Thin Solid Films; 1999; pp. 412-416; Elsevier Science S.A.

Lee, P.S. et al.; "Improved NiSi Salicide Process using Presilicide $N_2$+ Implant for MOSFETs"; IEEE Electron Device Letters; Dec. 2000; pp. 566-568; IEEE.

Lee, P.S. et al; "Nickel Silicide Formation on Si(100) and Poly-Si with a Presilicide $N_2$+ Implantation"; Journal of Electronic Materials; 2001; pp. 1554-1559; vol. 30, No. 12; Electronic Materials; USA.

(Continued)

*Primary Examiner*—Asok K. Sarkar
*Assistant Examiner*—Victor V. Yevsikov
(74) *Attorney, Agent, or Firm*—Robert L. King; Michael P. Noonan

(57) ABSTRACT

A method inhibits metal silicide encroachment in channel regions in a transistor that uses metal silicide as an electrical contact to its terminals. A metal layer is deposited overlying the transistor. A first anneal that is a low temperature anneal forms metal silicide regions to source, gate and drain terminals of the transistor. The low temperature inhibits lateral encroachment. Unsilicided portions of the metal are removed and followed by an ion implant of an element, such as nitrogen, that diffuses into the metal silicide regions. A second anneal at a higher temperature than the first anneal is completed wherein the implanted nitrogen ions prevent lateral encroachment of metal silicide.

28 Claims, 2 Drawing Sheets

OTHER PUBLICATIONS

Chao, Tien-Sheng et al.; "Performance Improvement of Nickel Salicided n-Type Metal Oxide Semiconductor Field Effect Transistors by Nitrogen Implantation"; Jpn J. Appl Phys.; Apr. 2002; pp. L381-l383; vol. 41; The Japan Society of Applied Physics; Japan.

Lee, P.S. et al; "Effect of Ion Implantation on Layer Inversion of Ni Silicided Polu-Si"; Journal of The Electrochemical Society; 2002; pp. G505-509; The Electrochemical Society, Inc.

Choi, Chei-Jong et al; "Effects of Hydrogen Implantation on the Structural and Electrical Properties of Nickel Silicide"; Journal of The Electrochemical Society; 2002; pp. G517-G521; The Electrochemical Society.

Wong, A.S.W. et al; $F$-enhanced morphological and thermal stability of NiSi films on $BF_2$+-implanted Si(001); Applied Physics Letters; Dec. 30, 2002; pp. 5138-5140; vol. 81, No. 27; American Institute of Physics; USA.

Lavoie, C. et al.; "Towards implementation of a nickel silicide process for CMOS technologies"; Article in Press; 2003, pp. 1-14; Elsevier B.V.

Oghuro, T. et al.; "Nitrogen-doped Nickel Monosilicide Technique for Deep Submicron CMOS Salicide"; IEEE; 1995; pp. 18.3.1-18.3.4.

Related U.S. Appl. No. 10/718,892, filed Nov. 21, 2003.

* cited by examiner

METHOD OF INHIBITING METAL SILICIDE ENCROACHMENT IN A TRANSISTOR

RELATED APPLICATION

This application is related to my copending U.S. patent application Ser. No. 10/718,892 entitled "Semiconductor Device With Silicided Source/Drains" and assigned to the assignee hereof.

FIELD OF THE INVENTION

This invention relates to semiconductor devices, and more particularly, to semiconductor devices with silicided source/drains.

RELATED ART

In common semiconductor manufacturing, semiconductor devices are made with lightly-doped drains at the junction with the channel and a relatively higher doped drain region used for making contact. The sources are made in the same way. The contact to the drain is made using a metal silicide. This contact is achieved by depositing the metal layer then reacting the metal layer with the silicon of the heavily-doped drain contact region to form a metal silicide contact region. The unreacted metal, which is located in the regions where there is no silicon, is then etched away with an etchant that is selective to the metal silicide. This metal silicide is then the contact point for the source and the drain of the semiconductor device.

One effective metal has been found to be cobalt. Cobalt is effective but has been found to be difficult to use for very small polysilicon dimensions. Thus, with cobalt there have been problems with achieving reliable and continuous cobalt silicide formed on narrow polysilicon lines. This is even called the "line width effect." Thus, other metals have been studied to overcome this problem. One promising metal is nickel. The use of nickel to form nickel silicide is effective for narrower line widths than have been found to be achievable for cobalt silicide. A difficulty with nickel silicide, however, has been encroachment of the silicide phase under a transistor spacer and into the channel regions of a transistor. This encroachment leads to electrical short circuiting of elements of the transistor, such as short circuiting between the source, drain and well. The encroachment therefore leads to very low integrated circuit manufacturing yields. There is a need for a technique for forming nickel silicide on source/drains that has improved manufacturability for transistors in an integrated circuit.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
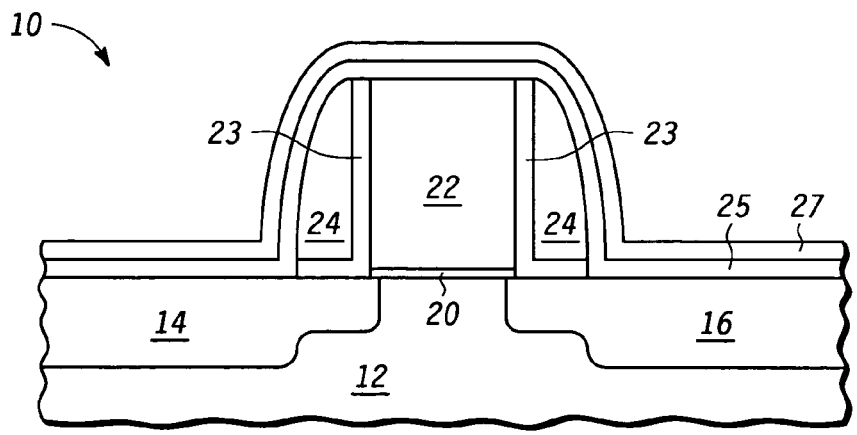
FIGS. 1–4 are cross sections of a semiconductor device at sequential stages in processing according to an embodiment of the invention.

Illustrated in FIG. 1 is a semiconductor device 10 having a substrate 12 upon which there is formed an integrated circuit including a transistor. The semiconductor device 10 has a source 14, a drain 16 and a gate 22. It should be understood herein that the use of a source and drain may be reversed in the illustrated form of semiconductor device 10. The gate 22 is separated from the substrate 12 by a gate dielectric 20 that is one of numerous insulating materials used in semiconductors. Adjacent the gate 22 and overlying a portion of the source 14 and drain 16 is a sidewall dielectric 23. Adjacent the sidewall dielectric 23 is a sidewall spacer 24. Overlying these elements is a metal layer 25. In one form, the metal layer 25 is made of nickel (Ni), but other metals may be used. Metal layer 25 is a conformal layer. Overlying metal layer 25 is a protection layer or cap layer 27. The cap layer 27 is typically a refractory metal or a refractory metal nitride such as Titanium (Ti) or Titanium Nitride (TiN). The cap layer 27 is also a conformal layer. Cap layer 27 functions to prevent exposure of the metal in metal layer 25 to a non-inert ambient between processing steps and therefore to prevent oxidation. It should be understood that the use of cap layer 27 is however optional. While a specific structure of semiconductor device 10 is illustrated, it should be understood that other transistor structures may be used in connection with the following processing steps to be described below. For example, a transistor having raised source and drain regions overlying an upper surface of the substrate 12 may be used. Additionally, the substrate 12 may overlie an insulator (not shown) and function as a silicon-on-insulator (SOI) structure. Substrate 12 may be implemented using single crystal silicon, germanium doped single crystal silicon or other silicon based epitaxial layers having other dopant materials.

Figure 2:
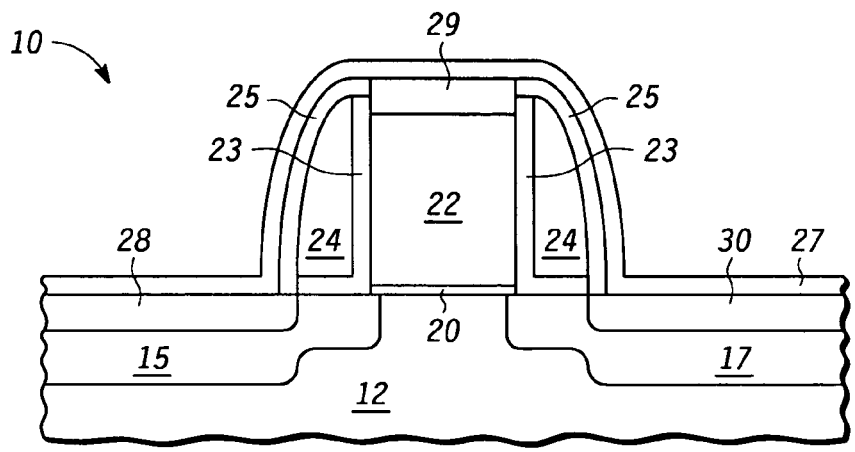

Illustrated in FIG. 2 is semiconductor device 10 upon further processing. In particular, a low temperature (i.e. temperatures for nickel silicide in a range of approximately 200 degrees Centigrade to 400 degrees Centigrade) anneal is implemented to form silicide regions 28, 29 and 30 respectively within the source, gate and drain. In one form when nickel is the metal, a thirty second anneal at a temperature of 340 degrees Centigrade is desirable.

A low temperature anneal is very important for the reason that when low temperature is used, lateral encroachment of newly formed silicide regions is avoided. Lateral encroachment in this context is the creation of silicide in areas that are underneath the sidewall spacer 24 and underneath the gate 22 in the channel region (not numbered). This encroachment leads to electrical short circuiting of elements of the transistor, such as short circuiting between the source, drain and well. The encroachment therefore leads to very low integrated circuit manufacturing yields. The encroachment is related to the high diffusivity of the metal coupled with the instability of the metal silicide phase. For example, under thermo-mechanical stress that exists in an integrated circuit, NiSi to $NiSi_2$ transformation takes place at moderately low temperatures just above 400 degrees Centigrade for nickel silicide. The formation of $NiSi_2$ consumes additional silicon and under the influence of the existing thermo-mechanical stresses proceeds laterally, thereby resulting in encroachment in the transistor's channel region.

When nickel in metal layer 25 and silicon in source 14 and drain 16 are heated to form a silicide, various phases of a silicide are possible. That means, for example, that Ni$_2$Si, Ni$_3$Si and Ni$_{31}$Si$_{12}$ may be present. As temperatures in the 200 hundred to 400 hundred Centigrade range stated above increase, the higher temperatures will tend to make these phases convert to NiSi followed by conversion to a thermodynamically stable NiSi$_2$ phase which results in encroachment. Therefore, the higher temperatures in this range may not always result in optimal structures. In any event, a low temperature anneal for nickel that is below 400 degrees Centigrade is desired. It should be understood that other temperature ranges exist when other types of metal silicide are used. For example, if cobalt silicide is used, a typical low temperature anneal range is approximately 400 degrees Centigrade to 550 degrees Centigrade. Within the area where source 14 was, there remains an unsilicided portion 15 immediately below silicide region 28 which now becomes the source of the semiconductor device 10. Silicide region 28 functions as an electrical contact to the unsilicided portion 15 functioning as the source. Within the area where drain 16 was, there remains an unsilicided portion 17 immediately below silicide region 30 which now becomes the drain of the semiconductor device 10. Silicide region 30 functions as an electrical contact to the unsilicided portion 17 functioning as the drain. The gate 22 is also modified. In particular, gate 22 is made smaller in total area by having a reduced height as a result of the formation of silicide region 29.

Figure 3:
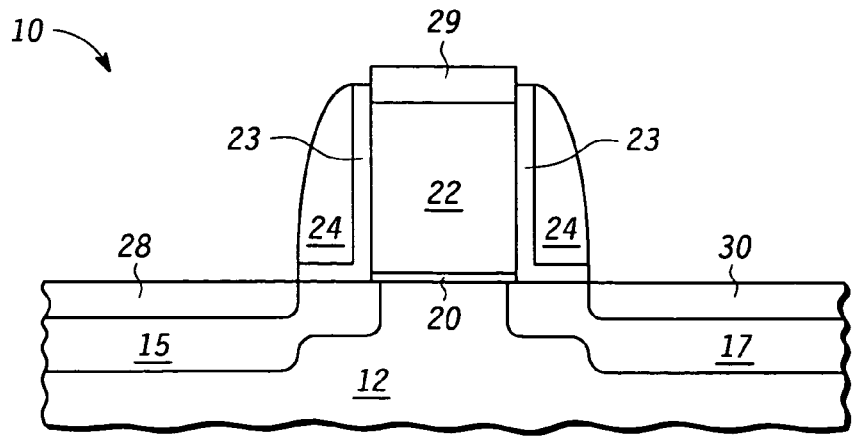

Illustrated in FIG. 3 is further processing of semiconductor device 10 wherein unsilicided portions of both the metal layer 25 and cap layer 27 are removed. The selective removal of these two layers is performed by an etch such as a conventional wet etch. The metal layer 25 functions to create the silicide regions 28, 29 and 30 in response to annealing. Once the silicide regions 28, 29 and 30 are formed, the unsilicided portions of metal layer 25 and its protective cap layer 27 (if implemented) are no longer needed. The wet etch chemistry leaves exposed surfaces of silicide regions 28, 29 and 30, sidewall spacer 24 and sidewall dielectric 23 without significantly modifying or damaging these surfaces.

Figure 4:
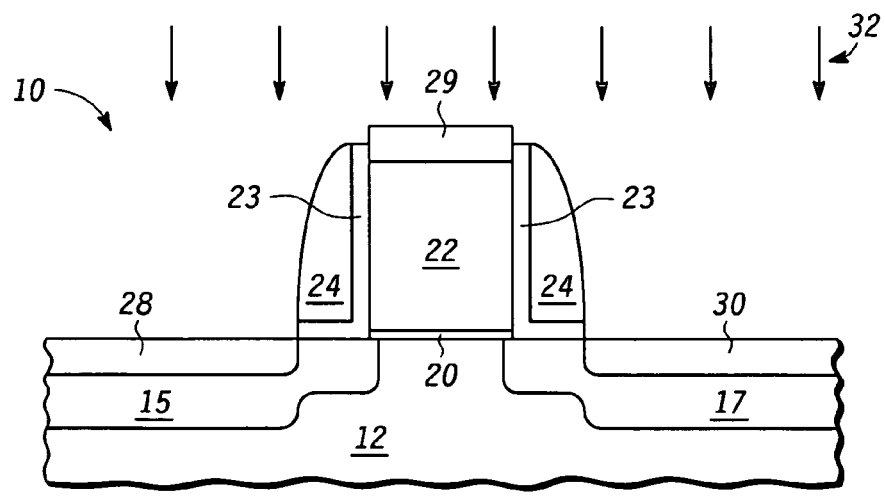

Illustrated in FIG. 4 is a processing step that is performed after the selective removal of the unsilicided portions of metal layer 25. In FIG. 4 an ion implant 32 of an ion species is performed. The ion implant 32 is an implant of ions of specific composition. In one form, nitrogen ions [either N or N$_2$ (dinitrogen)] are implanted. In other forms, either a hydrogen ion implant or a fluorine-based ion implant is performed. The ions are driven into each of the silicide regions 28, 29 and 30. Some penetration into sidewall spacer 24 occurs, but will have no electrical impact. The dose and the energy of the implanted ions are chosen such that the implant penetrates the entire region of silicide regions 28 and 30. In other words, the implanted ions go through each of these two regions and can go as far as slightly below each of silicide regions 28 and 30. It is desired to set the dosage and energy level to values such that the implanted ions do not go much further than immediately below the lower surface of each of silicide regions 28 and 30. In order to attain the desired ion implant, nitrogen (N$_2$) ions have an energy level that is approximately in the range of 1 Kev to 10 Kev. The value of the energy level that is desired within this range depends upon, in part, the thickness of the silicide regions 28 and 30. These thicknesses are a function of how thick the original metal layer 25 was. For a 200 Angstrom thick nickel silicide region 28 and 30, a desirable energy level for an N$_2$ ion implant to use in the implant is 5 KeV. It should be understood that other energy levels will be appropriate for other ion materials. In order to attain the desired ion implant, a dosage level for nitrogen (N$_2$) ions approximately in the range of approximately $1\times10^{14}$ to $2\times10^{15}$ atoms per cm$^2$ is recommended. An optimum value of the dosage within this range may be found by experimentally implementing prototype samples over the stated range and measuring which ion dose results in least metal silicide encroachment while not otherwise affecting device electrical characteristics.

Upon completion of the implant, semiconductor device 10 of FIG. 4 is then exposed to a high temperature silicidation anneal. For this anneal, a high temperature is defined as being approximately equal to or above 400 degrees Centigrade when nickel silicide is utilized. For example, when a nickel silicide is implement a range of anneal temperatures in the range of approximately 400 degrees Centigrade to 450 degrees Centigrade is used for a thirty second period.

For other metal silicides, the values of the temperature ranges for the low temperature and the high temperature may vary. The high temperature anneal completes formation of silicide regions 28 and 30. Because the nitrogen ions are present in the silicide regions 28 and 30, no or minimal metal silicide encroachment into the channel region separating the source and drain is present.

Figure 5:
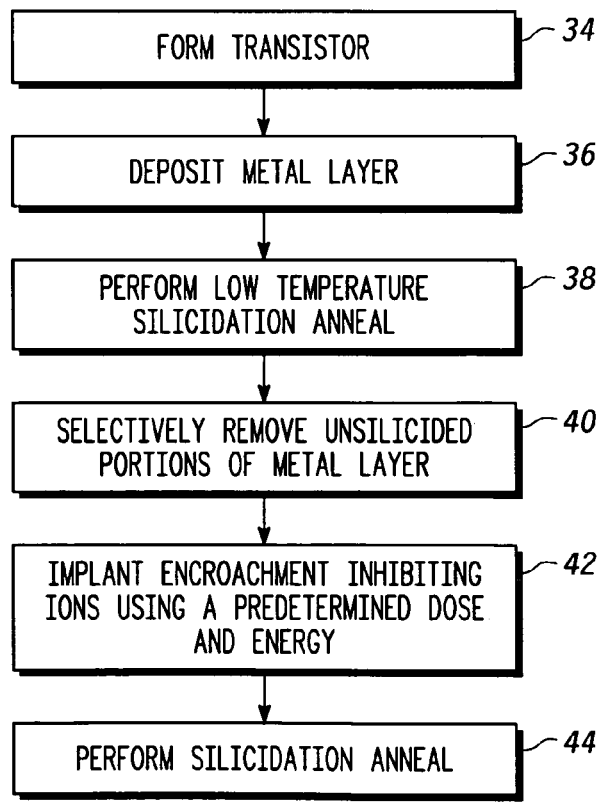
FIG. 5 illustrates in flow chart form processing steps associated with a method for inhibiting metal silicide encroachment in a transistor.

Illustrated in FIG. 5 is a flowchart of a method of inhibiting metal silicide encroachment in a transistor. In a step 34, a transistor is formed. The transistor has two current electrodes, such as a source and a drain, and a control electrode such as a gate. The gate has a channel region separating the two current electrodes. The channel region is the area of the transistor in particular in which encroachment of metal silicide is desired to be prevented. In a step 36 a metal layer is deposited overlying the transistor. In one form, the metal is deposited by sputtering. The metal layer is conformal and numerous metals may be used. In particular, cobalt (Co) and nickel (Ni) are appropriate metals. In a step 38, a low temperature silicidation anneal is performed. In one form, this anneal is implemented as a conventional rapid thermal anneal (RTA). In another form, a low temperature anneal performed on a hot plate in an inert ambient is implemented. For embodiments using nickel, the anneal is substantially in a range of 200 degrees Centigrade to 400 degrees Centigrade. By annealing at a temperature in this range, a metal silicide within the source and drain regions are formed without lateral growth of metal silicide towards the channel. In a step 40, unsilicided portions of the metal layer are selectively removed after the low temperature anneal. The selective removal is performed by a conventional wet etch. In a step 42, encroachment inhibiting ions are implanted by using a predetermined dose and energy as described above. The order of the ion implant following a first or initial anneal to create silicide regions is important. By using a low enough temperature to avoid lateral metal silicide encroachment, a metal silicide region is created. When a subsequent implant of nitrogen ions is performed in step 42, the nitrogen ions will assist in inhibiting metal silicide encroachment. In a step 44 a second anneal that is a high temperature anneal is performed. This anneal, in one form, is a rapid thermal anneal (RTA) that is conventional. In the presence of a metal silicide containing nitrogen ions, the nitrogen ions during this high temperature anneal substantially inhibit lateral metal silicide growth. It should be understood that step 44 is optional in the disclosed method at this point in time in those situations where subsequent processing of the integrated circuit containing the device will experience thermal processing near the required temperature.

By now it should be appreciated that there has been provided a nitrogen implant into a metal silicide layer to retard metal diffusion and improve thermal stability. The implant energy and dose of the implant are optimized so that device performance is not affected and the implant is restricted primarily to the metal silicide phase. Metal diffusion, such as in one form nickel diffusion, is retarded so that transformation of NiSi to NiSi$_2$ is delayed.

In the foregoing specification, the invention has been described with reference to specific embodiments. However, one of ordinary skill in the art appreciates that various modifications and changes can be made without departing from the scope of the present invention as set forth in the claims below. For example, while a single transistor is illustrated, the inhibition of metal silicide encroachment as taught herein is particularly advantageous for a plurality of transistors that are co-proximately or closely located. Various types of transistors may be used with the method disclosed herein such as bipolar transistors that have base, collector and emitter terminals. The transistors may be configured in numerous structural arrangements, such as being diode-connected where one of the current carrying electrodes is connected to a control electrode. Accordingly, the specification and figures are to be regarded in an illustrative rather than a restrictive sense, and all such modifications are intended to be included within the scope of present invention.

In one form there has been provided a method of inhibiting metal silicide encroachment in a transistor. A metal layer is deposited over a transistor structure. A silicidation anneal is performed to form metal silicide regions of terminals of the transistor structure at a first temperature sufficiently low to inhibit lateral encroachment of the metal silicide regions. Unsilicided portions of the metal layer are selectively removed from over the transistor. Encroachment inhibiting ions are implanted into the transistor after selectively removing the unsilicided portions of the metal layer. Another silicidation anneal is performed after implanting the encroachment inhibiting ions. In one form the step of performing another silicidation anneal after implanting the encroachment inhibiting ions is performed at a second temperature not substantially lower than the first temperature. In another form the first temperature is not substantially greater than 400° C. In this form the silicidation anneal after implanting the encroachment inhibiting ions is performed at a second temperature not substantially less than 400° C. In one form the metal that forms the metal layer is at least one of cobalt or nickel, and the metal silicide regions are a corresponding at least one of cobalt silicide or nickel silicide. In another form an encroachment inhibiting ion type is selected. An ion dose is determined before implanting the encroachment inhibiting ions. An ion energy is determined before implanting the encroachment inhibiting ions. In one form the encroachment inhibiting ions are selected from the group consisting of nitrogen-based ions, fluorine-based ions and hydrogen-based ions. In another form the encroachment inhibiting ions are dinitrogen. In one form the ion dose is determined to be less than $2\times10^{15}$ ions/cm$^2$. In another form the ion dose is determined to be greater than $1\times10^{14}$ ions/cm$^2$. In yet another form the ion dose is determined to be greater than $1\times10^{15}$ ions/cm$^2$. In yet another form the ion energy is determined to be less than 10 keV. In another form the ion energy is determined to be greater than 1 keV. In another form the ion energy is determined to be greater than 3 keV. In one form the step of performing the silicidation anneal is the performance of a rapid thermal anneal.

In another form there is provided a method of improving thermal stability of a metal silicide to decrease encroachment on a transistor channel in a transistor. A metal layer over the transistor is deposited. A silicidation anneal is performed within a first temperature range to form metal silicide regions of transistor terminals of the transistor. Unsilicided portions of the metal layer are selectively removed from over the transistor. Encroachment inhibiting ions are implanted into the transistor terminals after selectively removing the unsilicided portions of the metal layer. A silicidation anneal is performed within a second temperature range after implanting the encroachment inhibiting ions, the first temperature range including temperatures below temperatures in the second temperature range. In one form the first temperature range is selected to be sufficiently low to protect against lateral metal silicide mobility. In another form the second temperature range is selected to be sufficiently high to substantially complete metal silicidation. In one form the transistor terminals are a gate terminal and source/drain terminals. In another form the metal within the metal layer is nickel and the metal silicide regions are nickel silicide. In another form the encroachment inhibiting ions are dinitrogen gas ions. In another form a dinitrogen ion dose is selected having a value between $1\times10^{14}$ and $2\times10^{15}$ molecules/cm$_2$. A dinitrogen energy is selected between 1 keV and 10 keV. In another form the dinitrogen ion dose is selected to be about $5\times10^{14}$ ions/cm$_2$. In another form the dinitrogen energy is selected to be about 5 keV. A protection layer is formed over the metal layer after depositing the metal layer and before selectively removing the unsilicided portions of the metal layer. In one form the metal layer is nickel and the protection layer is titanium nitride. In yet another form there is provided a method of improving thermal stability of nickel silicide and inhibiting formation of nickel disilicide in a channel region of a transistor. A transistor structure including three transistor terminals is formed. Nickel is formed over each of the three transistor terminals. The transistor structure is heated at a temperature in a first temperature range sufficiently high to form nickel silicide regions of the three transistor terminals and sufficiently low to inhibit lateral encroachment of the nickel silicide regions. Encroachment inhibiting ions are implanted into the nickel silicide regions of the three transistor terminals after heating the transistor structure in the first temperature range. The transistor structure is heated at a temperature in a second temperature range after implanting the encroachment inhibiting ions. The first temperature range includes temperatures below temperatures in the second temperature range. The forming nickel over each of the three transistor terminals includes sputtering a layer of nickel over the transistor structure before heating the transistor structure. Unsilicided portions of the layer of nickel are wet etched from over non-terminal portions of the transistor structure after heating the transistor structure.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of inhibiting metal silicide encroachment in a transistor, the method comprising:
   depositing a metal layer over a transistor structure;
   performing a silicidation anneal to form metal silicide regions of terminals of the transistor structure at a first temperature sufficiently low to inhibit lateral encroachment of the metal silicide regions;
   selectively removing unsilicided portions of the metal layer from over the transistor; and
   implanting encroachment inhibiting ions into the transistor after selectively removing the unsilicided portions of the metal layer.

2. The method of claim 1 further comprising:
   performing another silicidation anneal after implanting the encroachment inhibiting ions.

3. The method of claim 2 wherein the step of performing another silicidation anneal after implanting the encroachment inhibiting ions is performed at a second temperature not substantially lower than the first temperature.

4. The method of claim 2 wherein
   the first temperature is not substantially greater than 400° C.; and
   the performing of the silicidation anneal after implanting the encroachment inhibiting ions is performed at a second temperature not substantially less than 400° C.

5. The method of claim 1 wherein the first temperature is not substantially greater than 400° C.

6. The method of claim 1 wherein metal comprising the metal layer comprises at least one of cobalt or nickel, and the metal silicide regions comprise a corresponding at least one of cobalt silicide or nickel silicide.

7. The method of claim 1 further comprising:
   selecting an encroachment inhibiting ion type;
   determining an ion dose before implanting the encroachment inhibiting ions; and
   determining an ion energy before implanting the encroachment inhibiting ions.

8. The method of claim 7 wherein the encroachment inhibiting ions are selected from the group consisting of nitrogen-based ions, fluorine-based ions and hydrogen-based ions.

9. The method of claim 7 wherein the encroachment inhibiting ions comprise dinitrogen.

10. The method of claim 9 wherein the ion dose is determined to be less than $2 \times 10^5$ ions/cm$^2$.

11. The method of claim 10 wherein the ion dose is determined to be greater than $1 \times 10^{14}$ ions/cm$^2$.

12. The method of claim 10 wherein the ion dose is determined to be greater than $1 \times 10^5$ ions/cm$^2$.

13. The method of claim 9 wherein the ion energy is determined to be less than 10 keV.

14. The method of claim 13 wherein the ion energy is determined to be greater than 1 keV.

15. The method of claim 13 wherein the ion energy is determined to be greater than 3 keV.

16. The method of claim 1 wherein the step of performing the silicidation anneal comprises performing a rapid thermal anneal.

17. A method of improving thermal stability of a metal silicide to decrease encroachment on a transistor channel in a transistor, the method comprising:
   depositing a metal layer over the transistor;
   performing a silicidation anneal within a first temperature range to form metal silicide regions of transistor terminals of the transistor;
   selectively removing unsilicided portions of the metal layer from over the transistor;
   implanting encroachment inhibiting ions into the transistor terminals after selectively removing the unsilicided portions of the metal layer; and
   performing a silicidation anneal within a second temperature range after implanting the encroachment inhibiting ions, the first temperature range including temperatures below temperatures in the second temperature range.

18. The method of claim 17 further comprising:
   selecting the first temperature range to be sufficiently low to protect against lateral metal silicide mobility; and
   selecting the second temperature range to be sufficiently high to substantially complete metal silicidation.

19. The method of claim 17 wherein the transistor terminals comprise a gate terminal and source/drain terminals.

20. The method of claim 17 wherein metal within the metal layer comprises nickel and the metal silicide regions comprise nickel silicide.

21. The method of claim 17 wherein the encroachment inhibiting ions comprise dinitrogen gas ions.

22. The method of claim 21 further comprising:
   selecting a dinitrogen ion dose having a value between $1 \times 10^n$ and $2 \times 10^{15}$ molecules/cm$^2$; and
   selecting a dinitrogen energy between 1 keV and 10 keV.

23. The method of claim 22 wherein the dinitrogen ion dose is selected to be about $5 \times 10^{14}$ ions/cm$^2$.

24. The method of claim 22 wherein the dinitrogen energy is selected to be about 5 keV.

25. The method of claim 17 further comprising:
   forming a protection layer over the metal layer after depositing the metal layer and before selectively removing the unsilicided portions of the metal layer.

26. The method of claim 25 wherein the metal layer comprises nickel and the protection layer comprises titanium nitride.

27. A method of improving thermal stability of nickel silicide and inhibiting formation of nickel disilicide in a channel region of a transistor, the method comprising:
   forming a transistor structure including three transistor terminals;
   forming nickel over each of the three transistor terminals;
   heating the transistor structure at a temperature in a first temperature range sufficiently high to form nickel silicide regions of the three transistor terminals and sufficiently low to inhibit lateral encroachment of the nickel silicide regions;
   implanting encroachment inhibiting ions into the nickel silicide regions of the three transistor terminals after heating the transistor structure in the first temperature range; and
   heating the transistor structure at a temperature in a second temperature range after implanting the encroachment inhibiting ions, the first temperature range including temperatures below temperatures in the second temperature range.

28. The method of claim 27 wherein the step of forming nickel over each of the three transistor terminals comprises:
   sputtering a layer of nickel over the transistor structure before heating the transistor structure; and
   wet etching unsilicided portions of the layer of nickel from over non-terminal portions of the transistor structure after heating the transistor structure.

* * * * *